United States Patent [19]
Nishi

[11] Patent Number: 5,626,456
[45] Date of Patent: May 6, 1997

[54] TRANSFER DEVICE

[75] Inventor: Hironobu Nishi, Sagamihara, Japan

[73] Assignees: Tokyo Electron Limited, Tokyo; Tokyo Electron Tohoku Limited, Esashi, both of Japan

[21] Appl. No.: 508,242

[22] Filed: Jul. 27, 1995

Related U.S. Application Data

[63] Continuation of Ser. No. 214,210, Mar. 17, 1994, abandoned.

[30] Foreign Application Priority Data

Mar. 18, 1993 [JP] Japan ............... 5-085754

[51] Int. Cl.$^6$ ................................ B65G 65/00
[52] U.S. Cl. ............. 414/404; 414/331; 414/416; 414/937; 414/941
[58] Field of Search ............... 414/404, 331, 414/416, 417, 172, 156, 937, 941; 294/64.1

[56] References Cited

U.S. PATENT DOCUMENTS

| | | | |
|---|---|---|---|
| 4,770,590 | 9/1988 | Hugues et al. | 414/172 |
| 4,775,281 | 10/1988 | Prentakis | 414/331 X |
| 5,110,248 | 5/1992 | Asano et al. | 414/416 X |
| 5,162,047 | 11/1992 | Wada et al. | 414/416 X |
| 5,183,370 | 2/1993 | Cruz | 414/941 X |
| 5,221,201 | 6/1993 | Yamaga et al. | 414/937 X |
| 5,275,521 | 1/1994 | Wada | 414/416 X |
| 5,297,910 | 3/1994 | Yoshioka et al. | 414/937 X |

FOREIGN PATENT DOCUMENTS

| | | | |
|---|---|---|---|
| 62-47143 | 2/1987 | Japan | 414/937 |
| 2031440 | 2/1990 | Japan | 414/937 |
| 4106952 | 4/1992 | Japan | 414/937 |
| 4361551 | 12/1992 | Japan | 414/937 |

*Primary Examiner*—Karen B. Merritt
*Assistant Examiner*—Stephen Gordon
*Attorney, Agent, or Firm*—Oblon, Spivak, McClelland, Maier & Neustadt, P.C.

[57] ABSTRACT

A wafer transfer device for transferring wafers between a wafer boat having a plurality of ring-shaped support plates arranged one above another, and a cassette capable of supporting semiconductor wafers at different levels. The support plates have a hole in a center portion and define a vertical passage. Wafers are carried in a horizontal direction between the boat and the cassette by a carrying mechanism having at least two forks. A movable push-up disk is moved up and down through the passage by a drive device. The extension member extends through the passage and has an upper end portion supporting the push-up disk and a lower end portion connected to the drive device and located below a lowermost one of the support plates. A controller controls the carrying mechanism and the push-up disk in interlock fashion. Thereby, the forks are simultaneously moved forward or backward to move wafers horizontally into the cassette and position them at the different levels in the cassette or to move the wafers from the cassette, and are independently moved forward or backward to move the wafers horizontally into the boat and place them on the support plates or to move them from the boat.

14 Claims, 4 Drawing Sheets

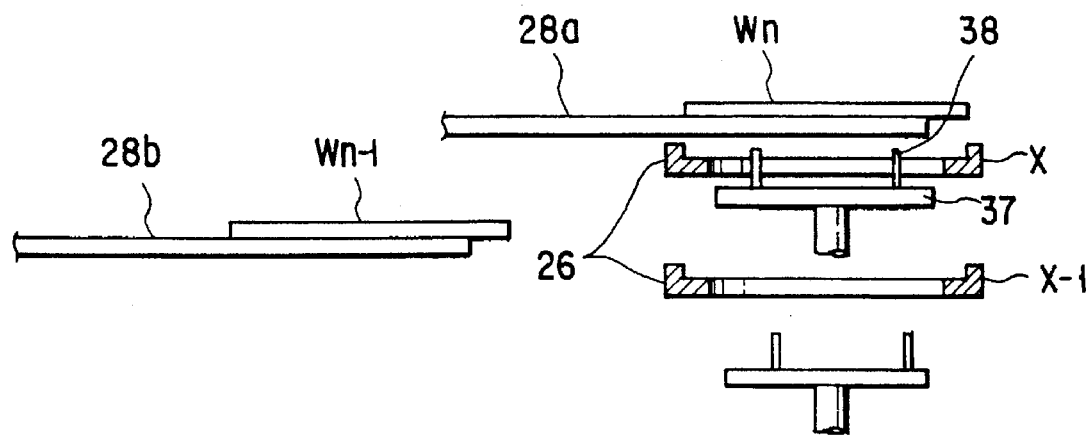
F I G. 5
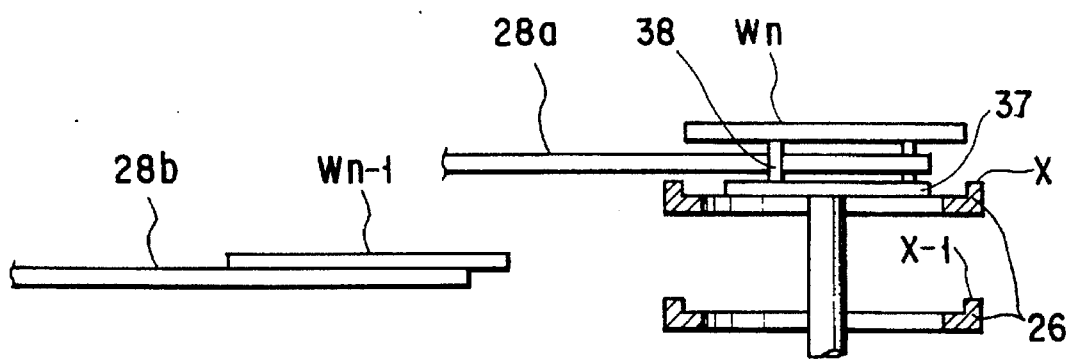
F I G. 6
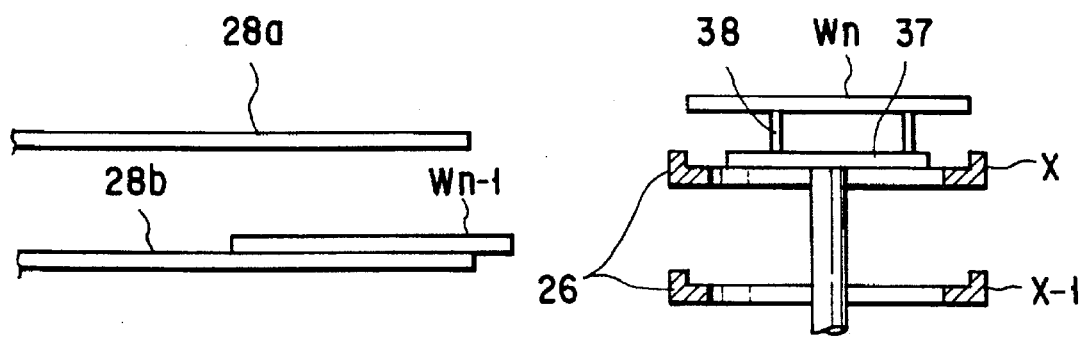
F I G. 7

TRANSFER DEVICE

This application is a Continuation of application Ser. No. 08/214,210, filed on Mar. 17, 1994, now abandoned.

BACKGROUND OF THE INVENTION

1. Field of the Invention

The present invention relates to a transfer device for transferring plate-shaped objects.

2. Description of the Related Art

The recent trend is that more and more vertical heating furnaces are used, instead of the conventional horizontal heating furnaces, as apparatus for heat-processing semiconductor wafers (hereinafter called "wafers") in the course of manufacturing semiconductor devices. In a vertical heating furnace, a plurality of wafers are heat-processed while being held in a wafer boat, positioned one above another and parallel to one another. The wafer boat is moved into the furnace, thereby loading the wafers thereinto, and moved out of the furnace, thus unloading the wafers therefrom.

The wafer boat is a holding device shaped like a hollow cylinder and is made of, for example, quartz which has high heat resistance and high chemical stability. It comprises, for example, four vertical support rods, each having grooves. The wafer boat holds wafers, each set at its circumferential portion in the four grooves made in the four support rods. Hence, the wafers are held parallel to one another and one above another.

Each wafer undergoes various processes in various apparatuses incorporated in a system for manufacturing semiconductor devices. The wafer is transferred among these apparatuses, loaded into one apparatus and unloaded therefrom. A wafer carrier, a container made of, for example, resin, is used to contain a plurality of wafers and transfer them from one apparatus to another.

Attempts have been made to utilize more rapidly decreasing temperatures in heat treating wafers in order to enhance throughput. One of them is to mount wafers on ring-shaped support plates which are attached to a wafer boat, respectively. More specifically, as shown in FIG. 1, a number of ring-shaped support plates 11 are attached to the support rods 12 of a wafer boat, each having a recessed surface 11a and defining a wafer-mounting level. A wafer W is mounted on the recessed surface 11a of each ring-shaped support plate 11, contacting the plate 11 at its circumferential portion. Heat of the circumferential portion of wafers W can therefore be transmitted outside from the wafer W through the plate 11, and the temperature difference between the circumferential and center portions of the wafer W can be reduced. As a result, the temperature of the wafer W can be uniformly lowered and raised even if the rate at which the wafer W is heated is raised.

Wafers are placed within a wafer carrier and are moved among the apparatus incorporated a system for manufacturing semiconductor devices. After the wafer carrier reaches an apparatus having a vertical heating furnace of the type described above, the wafers are transferred onto a wafer boat. The wafer boat is moved into the vertical heating furnace, loading the wafers into the furnace. The wafers W are heat-processed in the furnace. The wafer boat holding the heat-processed wafers W is removed from the furnace, thus unloading the wafers therefrom. Then, the wafers are transferred from the wafer boat back into the wafer carrier. Thus, the wafers must be transferred between the carrier and the boat, so as to be loaded into and unloaded from each apparatus of the system for manufacturing semiconductor devices.

Hitherto, wafers have been transferred between a carrier and a boat, one by one, by means of a transfer device. The transfer device comprises a plate-shaped fork and a drive mechanism for driving the fork. Driven by the mechanism, the fork is inserted into the wafer carrier or the wafer boat, transferring a wafer between the carrier and the boat. A new type of a transfer device has been developed, which comprises a plurality of forks and a drive mechanism and which can transfer a plurality of wafers at a time.

Either type of a conventional transfer device is disadvantageous. To hold a wafer W, the fork is forwarded into a space below the wafer and then lifted, and moved backward. When the conventional transfer device is used to transfer wafers W onto and from the wafer boat of the type shown in FIG. 1, the fork abuts the ring-shaped support plate 11 as it is moved upwards or downwards.

It is therefore necessary to use, besides the fork, a push-up mechanism for moving a wafer W upward or the ring-shaped support plate 11 so as to position the wafer W at the predetermined level. The fork can move at the level without abutting the ring. A transfer device having such a push-up mechanism is disclosed in, for example, U.S. Pat. No. 5,275,521 (U.S. patent application Ser. No. 07/907,545 filed on Jul. 2, 1992). In this transfer device, a push-up disk, which can be moved up and down, is lifted from under a ring-shaped support plate of a wafer boat, lifting a wafer upward from the fork. Then, the fork is moved away from the wafer, thereby placing the wafer onto the push-up disk. Finally, the push-up disk is lowered, mounting the wafer onto the ring-shaped support plate.

This transfer device, however, transfers wafers between a wafer carrier and a wafer boat, only one at a time. The device inevitably requires a long time to transfer all wafers from the carrier to the boat, or vice versa. Consequently, the throughput is low. In the wafer transfer device which can remove a plurality of wafers from a carrier at a time, a plurality of forks are moved simultaneously. If the aforementioned push-up mechanism is incorporated in this wafer transfer device, it can lift but only one wafer at a time. In other words, the push-up mechanism cannot lift a plurality of wafers held on the forks of the wafer transfer device.

SUMMARY OF THE INVENTION

The object of the present invention is to provide a transfer device for transferring, with a great throughput, plate-shaped objects between a container for transporting the objects and a member for holding the objects.

According to the invention, there is provided a transfer device for transferring plate-shaped objects between a container in which a plurality of object-mounted levels are vertically arranged having intervals between them, and a holding member in which a plurality of ring-shaped support plates are vertically arranged having intervals between them, the ring-shaped support plates having a hole in a center portion, and defining a vertical passage, the transfer device comprising:

carrying means for horizontally carrying the plate-shaped objects into and out of the container between the object-mounted levels and also into and out of the holding member between the ring-shaped support plates, the carrying means having at least two forks for holding the plate-shaped objects and a horizontal drive means for independently driving the forks horizontally;

lift means for moving the carrying means upwards and downwards with respect to the container and the holding member;

a push-up disk movable upwards and downwards through the passage;

an extension member extending down through the passage with a lower end beyond a lowermost one of the ring-shaped support plates, and supporting at an upper end the push-up disk;

drive means connected to the lower end portion of the extension member, for driving the extension member to thereby moving the push-up disk up and down; and control means for controlling the carrying means and the push-up disk in interlock fashion, such that the forks are simultaneously moved forward or backward to move the plate-shaped object horizontally into and out of the container and position the plate-shaped objects at the object-mounted levels in the container or to move the plate-shaped objects from the container, and the plate-shaped objects horizontally into the holding member and place the plate-shaped objects on the support plates or to move the plate-shaped objects from the holding member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 to 9 are diagrams explaining how the forks and push-up mechanism, all incorporated in the wafer-carrying means, operate to mount wafers on the support plates of the wafer boat.

DETAILED DESCRIPTION OF THE PREFERRED EMBODIMENTS

Embodiments of the present invention will now be described in detail, with reference to the accompanying drawings.

Figure 1:
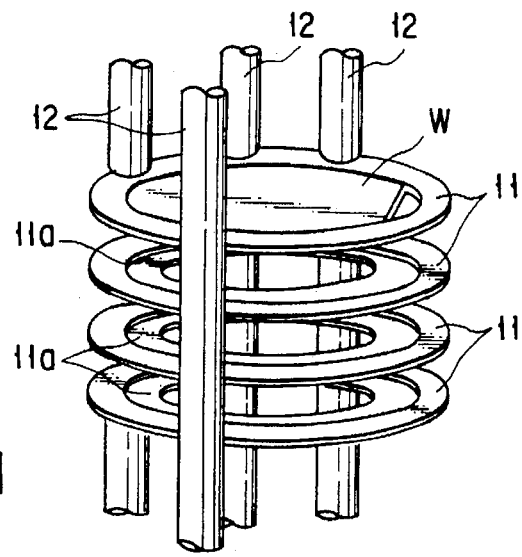
FIG. 1 is a perspective view showing a part of a wafer boat which has ring-shaped wafer support plates and also showing a wafer mounted on one of the support plates.
Figure 2:
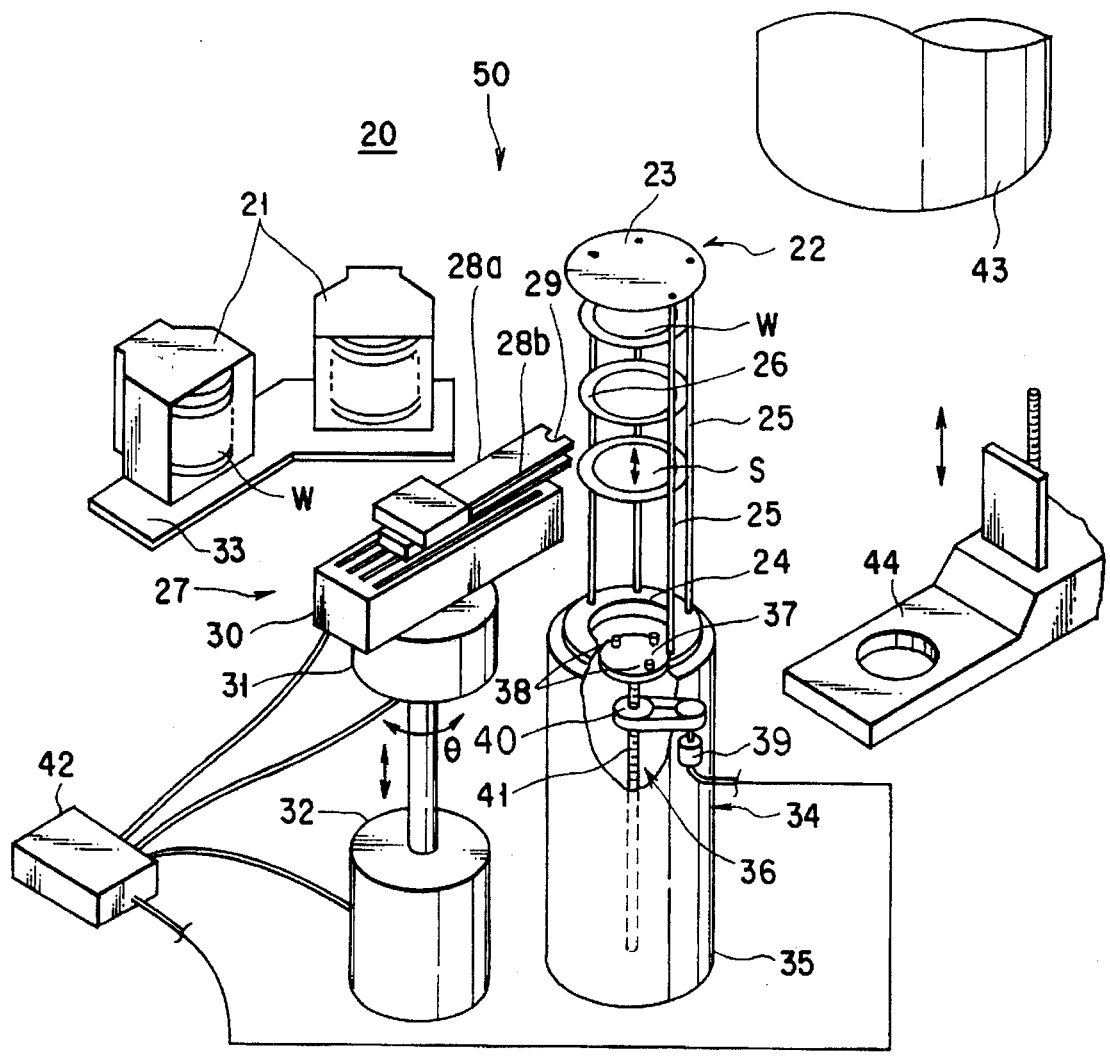
FIG. 2 is a schematic view of a wafer transfer device according to the present invention.

FIG. 2 shows a wafer transfer device 50 in a vertical wafer heat processing apparatus 20, according to the present invention, which is designed to transfer wafers W between a wafer carrier 21 and a wafer boat 22. The wafer boat 22, holding the wafers W transferred from the carrier 21, is moved into a vertical heating furnace 43 and moved therefrom after the wafers W are heat-processed in the furnace.

The wafer carrier 21 has a number of grooves. It contains a plurality of wafers W, each held in one groove at circumferential portion. The wafers W are positioned one above another, spaced apart at intervals of about 6.35 mm. In this instance, two carriers 21 are mounted on a carrier table 33, each holding 25 wafers W.

The wafer boat 22 is made of material having high heat resistance, such as quartz. It comprises a top plate 23, a ring-shaped bottom plate 24 spaced apart from the top plate 23, and four support rods 25 extending vertically between the the plates 23 and 24. The wafer boat 22 further comprises a plurality of ring-shaped support plates 26, for example support plates 26, each for supporting the circumferential portion of a wafer W. The ring-shaped support plates 26 are attached to the support rods 25 and spaced apart one above another at intervals of, for example, about 11 mm. The ring-shaped support plates 26 are aligned coaxial with one another, defining a vertical passage S. The support plates 26 have a recess for holding the circumferential portion of a wafer W, as is disclosed in the above-identified U.S. Pat. No. 5,275,521.

The wafer transfer device 50 further comprises a wafer-carrying means 27 for transporting wafers W between either wafer carrier 21 and the wafer boat 22. The means 27 has two forks 28a and 28b. The forks 28a and 28b are positioned one above the other and attached to a base 30. The base 30 contains a drive means (later described) for driving the forks 28a and 28b independently in horizontal direction. The forks 28a and 28b have a guide (not shown) each, which is used to prevent an displacement of a wafer W. Each fork has a notch 29 for holding a pin of a push-up mechanism 34 which will be described later.

The forks 28a and 28b may have the structure detailed in the specification of U.S. Pat. No. 5,275,521. To state more precisely, each fork may have on its upper surface a raised circular wafer-supporting portion. The raised portion contacts the underside side of a wafer W while the fork holds the wafer W, holding the wafer W. The raised portion may be coated with SiC by means of CVD. Made convex, the raised portion contacts the wafer W at a very small area. Coated with smooth SiC film having a mirror surface, thus, the raised portion serves to prevents dust from rising while the wafers W are transferred, ultimately preventing contamination of the wafer surface.

The forks 28a and 28b are set apart for a distance almost equal to the intervals between the support plates 26 of the wafer boat 22. Hence, it is unnecessary to move one fork up or down to transfer a wafer between the carrier 21 and the boat 22 after the other fork has transferred a wafer therebetween.

Figure 3:
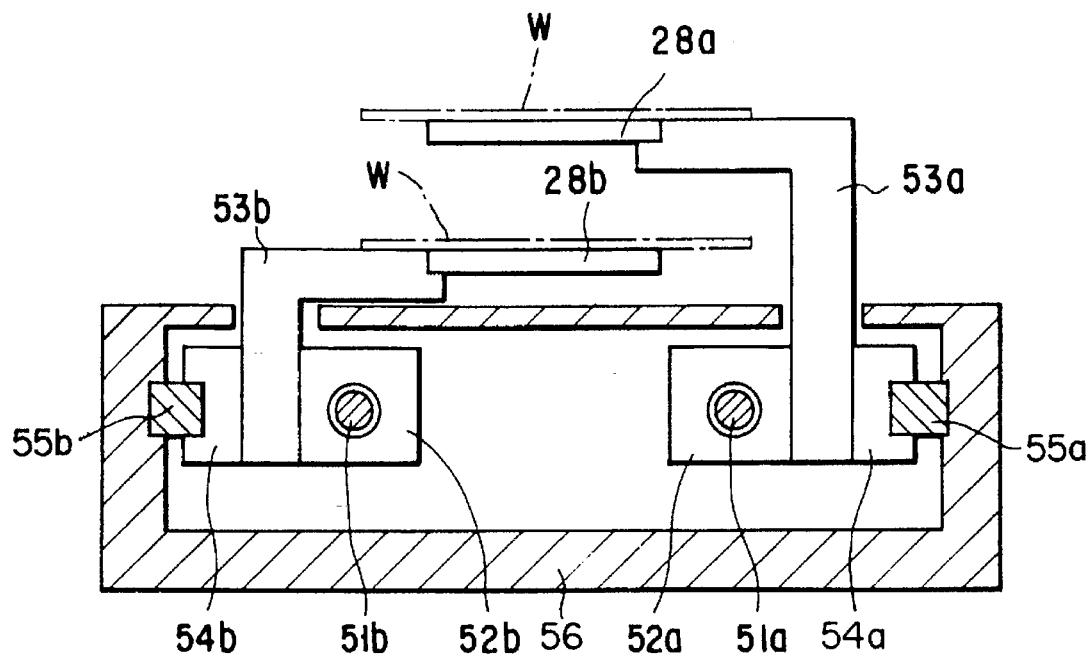
FIG. 3 is a diagram illustrating the drive section incorporated in the wafer transfer device, for driving the forks of the wafer-carrying means also used in the wafer transfer device.

As shown in FIG. 3, the base 30 contains two ball screws 51a and 51b extending parallel in the same horizontal plane. The ball screws 51a and 51b are connected at one end to two electric motors (not shown) such as a stepping motors, respectively. Connectors 52a and 52b are mounted on the ball screws 51a and 51b. They can be moved along the screws 51a and 51b, in the same horizontal plane, as the electric motors rotate the ball screws 51a and 51b. An L-shaped support member 53a is fastened to the first connector member 52a and supports the first fork 28a. Similarly, an L-shaped support member 53b is secured to the second connector member 52b and supports the second fork 28b. Guide members 54a and 54b are attached to the lower ends portions of the L-shaped support members 53a and 53b, at the outer sides thereof. Each of the guide members 54a and 54b has a groove made in the outer side. The members 54a and 54b are mounted on guide rails 55a and 55b which are secured to the opposing inner surfaces of the main body 56 of the base 30. More precisely, the guide members 54a and 54b are placed in sliding engagement with the guide rails 55a and 55b, respectively. The ball screws 51a and 51b and the guide rails 55a and 55b serve to prevent any displacement of wafers W during the transfer of the wafers W. The components 51a, 51b, 52a, 52b, 53a, 53b, 54a, 54b, and 55a and 55b cooperate, enabling the forks 28a and 28b to move independently, to transfer wafers W between either wafer carrier 21 and the wafer boat 22.

The base 30 is mounted on a rotary mechanism 31 which can rotate around a vertical axis—that is, in the θ direction. The rotary mechanism 31 is located atop a lift mechanism 32 comprising a ball screw and the like. The forks 28a and 28b, both coupled to the base 30, can therefore move horizontally and vertically and can also rotate in a horizontal plane with the rotary mechanism 31 and the lift mechanism 32.

The wafer carriers 21 and the wafer boat 22 are arranged in a circle having a center located at the axis of the base 30.

The push-up mechanism 34 comprises a base 35, a drive section 36 and a push-up disk 37. The drive section 36 is housed within the base 35. The push-up disk 37 can move through the passage S defined by the opening of the bottom plate 24 of the wafer boat 22 and those of the ring-shaped support plates 26 held in the boat 22, to thereby push wafers W up from, and lower them onto, the support plates 26. Three projections 38 protrude from the upper surface of the push-up disk 37 which can abut the underside of a wafer W so that the wafer W may be pushed upwards. The projections 38 are arranged, for example, at the apices of a regular triangle. Any two adjacent projections 38 are spaced apart by a distance longer than the width of the forks 28a and 28b. One of the three projections 38 can fit into the notch 29 cut in the distal end of either fork.

The drive section 36 of the push-up mechanism 34 comprises an electric motor 39, a pulley 40, and a ball screw 41. The pulley 40 is set in screw engagement with the ball screw 41. A belt is wrapped around the pulley 40 and a pulley mounted on the shaft of the motor 39. Thus, when the belt is driven by the motor 39, rotating the pulley 40 on the ball screw 41, the push-up disk 37 will move up or down through the passage S without slipping out of the passage S, between the lowest support plate of the boat 22 and the uppermost wafer support plate thereof.

The wafer transfer device 50 further comprises a control section 42. The control section 42 is electrically connected to the motors housed in the base 30, the electric motor (not shown) located in the rotary mechanism 31, the electric motor (not shown) provided in the lift mechanism 32, and the motor 39 of the push-up mechanism 34. The section 42 has a memory (not shown) storing a prescribed program, and controls the motors in accordance with this program.

As shown in FIG. 2, a boat elevator 44 is provided for inserting the wafer boat 22 into a vertical heating furnace 43, thereby loading wafers W thereinto, and for moving the boat 22 from the furnace 43, thereby unloading the wafers W therefrom.

It will now be explained how the wafer transfer device 50 operates to transfer wafers W between either wafer carrier 21 and the wafer boat 22, as the control section 42 supplies controls signals to the electric motors in accordance with the program stored in the memory.

Wafers W are transferred from the carrier 21 to the boat 22 in the following steps:

Step 1:
The forks 28a and 28b and base 30 of the wafer-carrying means 27, and the push-up disk 37 of the push-up mechanism 34 are set at predetermined home positions.

Step 2:
The wafer-carrying means 27 is turned on. The base 30 rotates and moves downward or upward, bringing the forks 28a and 28b to levels slightly lower than those of the wafers Wn and Wn-1 held in the carrier 21. Thus, the forks 28a and 28b can be inserted, slightly below the wafers Wn and Wn-1, respectively. At the same time, the push-up disk 37 of the mechanism 34 is lifted to a level a little below that of a selected one X of the plates 26, as shown in FIG. 5. At this level, the projections 38 of the disk 37 have their upper ends at the same level as or below the upper surface of the support plate X.

Step 3:
Both motors housed in the base 30 are driven in one direction, simultaneously moving the forks 28a and 28b horizontally into the wafer carrier 21.

Step 4:
The lift mechanism 32 of the wafer-carrying means 27 lifts the base 30, whereby the forks 28a and 28b move upwards, lifting the wafers Wn and Wn-1.

Step 5:
The motors located in the base 30 are driven in the opposite direction, simultaneously moving the forks 28a and 28b backward horizontally from the wafer carrier 21. The wafers Wn and Wn-1 are thereby removed from the wafer carrier 21.

Step 6:
The wafer-carrying means 27 is driven such that the base 30 rotates and moves up or down until the the first fork 28a reaches the front of the ring-shaped support plate and a level where its lower surface is located slightly above the ring-shaped support plate X, while the second fork 28b reaches a lower level.

Figure 4:
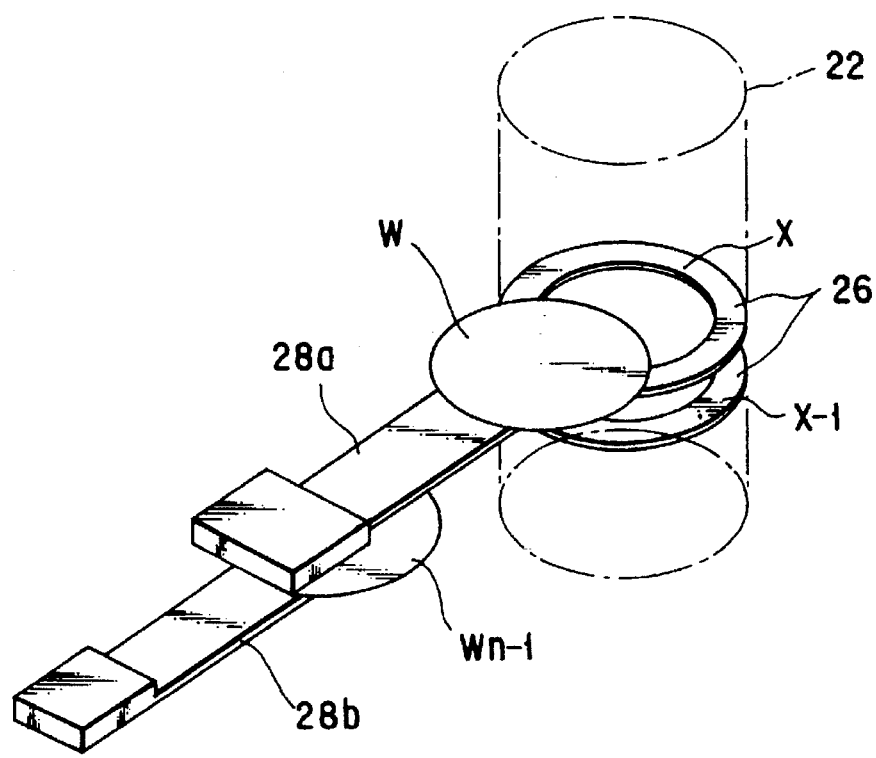
FIG. 4 is a diagram explaining how the forks are driven to mount wafers onto the support plates of a wafer boat.

Step 7:
Only the first motor located in the base 30 is driven in one direction, thrusting the first fork 28a into the wafer boat 22, as is illustrated in FIG. 4. The wafer Wn supported by the first fork 28a is thereby moved to a position slightly above the support plate X.

Step 8:
The push-up mechanism 34 is driven, moving the push-up disk 37 upwards by a one-pitch distance. As a result of this, the wafer Wn is lifted and transferred from the first fork 28a onto the upper ends of the projections 38, as is illustrated in FIG. 6.

Step 9:
The first motor provided in the base 30 is driven in the opposite direction, pulling the first fork 28a from the wafer boat 22, as is shown in FIG. 7.

Step 10:
The push-up mechanism 34 is driven, moving the push-up disk 37 downwards by a one-pitch distance, whereby the wafer Wn is mounted on the ring-shaped support plate X.

Figure 8:
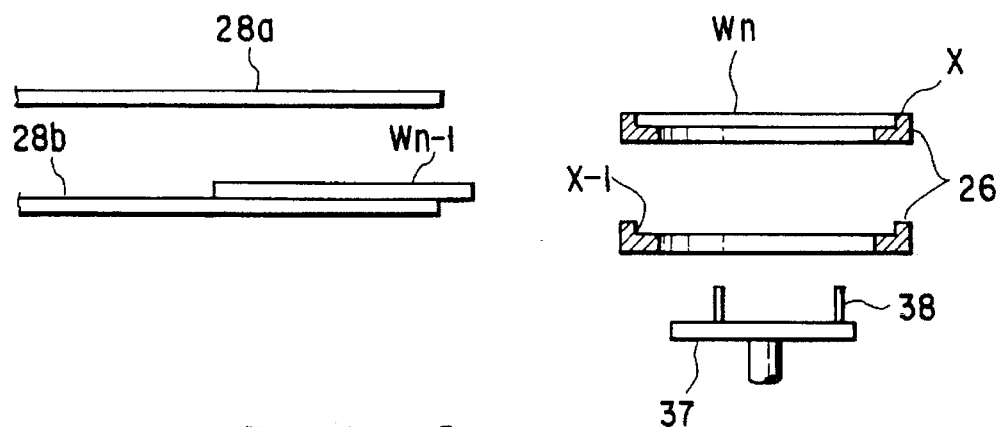

Step 11:
The push-up mechanism 34 is driven, moving the push-up disk 37 downwards, to a level lower than the level of the support plate X-1 which is located immediately below the wafer W, as is illustrated in FIG. 8.

Figure 9:
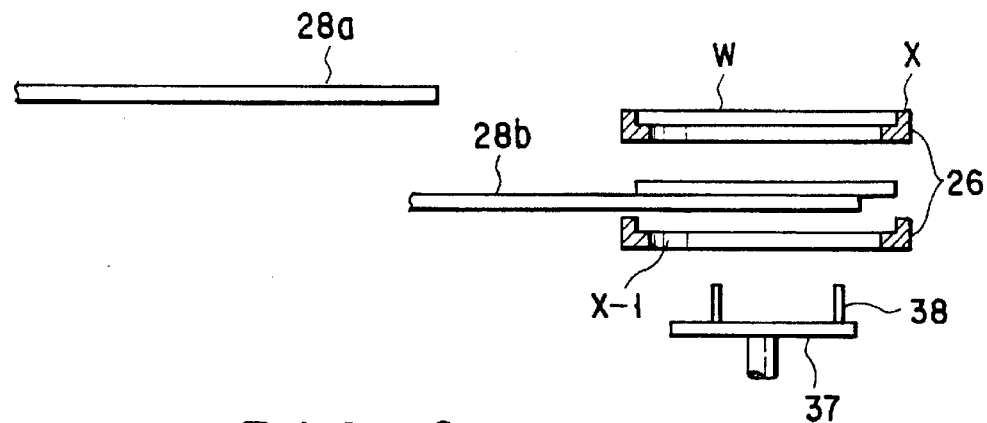

Step 12:
Only the second motor provided in the base 30 is driven in one direction, moving the second fork 28b into the wafer boat 22, as is illustrated in FIG. 9. Hence, the wafer Wn-1 mounted by the second fork 28a is moved to a position slightly above the support plate X-1.

Step 13:

The push-up mechanism 34 lifts the push-up disk 37 by a one-pitch distance. As a result, the wafer Wn-1 is transferred from the second fork 28b onto the upper ends of the projections 38 of the push-up disk 37.

Step 14:

The second motor provided in the base 30 is driven in the opposite direction, pulling the second fork 28b from the wafer boat 22.

Step 15:

The push-up mechanism 34 lowers the push-up disk 37, whereby the wafer Wn-1 is transferred from the push-up disk 37 onto the ring-shaped wafer supporting plate X-1.

Step 16:

The wafer-carrying means 27 is driven, and the base 30 rotates and moves up or down, bringing the forks 28a and 28b to positions where they face two other wafers both held in the carrier 21 and set at levels slightly lower than those of the wafers Wn and Wn-1. At the same time, the push-up disk 37 is lifted to a level a little below that of another selected one X of the plates 26.

Thereafter, every time Steps 2 to 16 are repeated, two other wafers W are transferred from the wafer carrier 21 onto two adjacent support plates 26 of the wafer boat 22. When a predetermined number of wafers W, e.g., 50 wafers, have been transferred into the wafer boat 22, the wafer boat 22 is transferred from the push-up mechanism 34 onto the boat elevator 44 by means of a boat transfer mechanism (not shown). The elevator 44 loads the wafer boat 22 into the vertical heating furnace 43. In the furnace 43, the wafers W held in the boat 22 are subjected to a heating process such as CVD, oxidation, impurity diffusion or etching.

After the wafers W have been heat-processed, the wafer boat 22 is unloaded from the heating furnace 43 and placed on the base 35 of the push-up mechanism 34. Then, Steps 1 to 16 are performed in the reverse order, thereby transferring the wafers W, in units of two wafers, from the boat 22 into the wafer carrier 21.

As described above, the wafer-carrying means 27 having two forks 28a and 28b removes two wafers W at a time, from the wafer carrier 21. Thus it suffices to rotate the base 30 only twice to transfer two wafers from the carrier 21 into the boat 22, whereas the base 30 should be rotated four times if the means 27 had only one fork. The time required for transferring wafers W is shorter, and the throughput is therefore higher, than in the case where the means 27 has one fork. More specifically, when 50 wafers W are transferred from the carrier 21 into the boat 22, the throughput of the wafer transfer device 50 can be increased by 30% as compared with the throughput of the conventional device having one fork.

The number of forks which the wafer-carrying means 27 has is not limited to two. The means 27 may have three or more forks. The more forks the means 27, the higher can be the throughput of the wafer transfer device 50. Furthermore, the means 27 may be so designed as to adjust the distance between the forks 28a and 28b. In this case, even if the distance between two adjacent support plates 26 of any wafer boat 22 differs from that between two adjacent support plates 26 of the other wafer boat, the forks 28a and 28b need not be moved up or down to place wafers W on the support plates 26.

Figure 10:
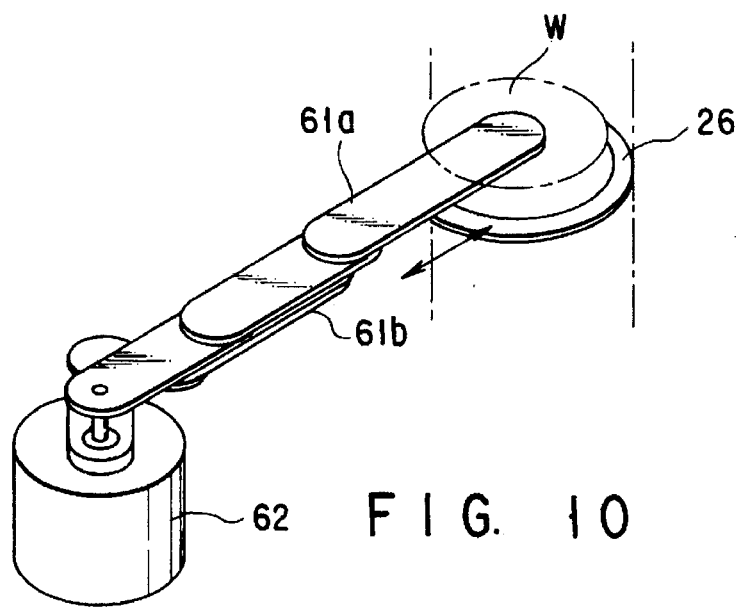
FIG. 10 is a perspective view showing a drive section which may be incorporated in the wafer transfer device, in place of the drive section illustrated in FIG. 3.

The means for moving a wafer W in a horizontal plane may have, for example, two multi-joint arms 61a and 61b as shown in FIG. 10. The arms 61a and 61b are connected to an electric motor 62 such that they are independently driven by the motor 62.

The present invention can be applied to the case where the wafer-carrying means 27 is located at a fixed level, while the wafer carrier 21 and the wafer boat 22 can be moved upwards and downwards. The embodiment described above can transfer not only semiconductor wafers W. But also can it transfer LCD substrates, printed circuit boards, and any other plate-shaped objects.

The term "ring-shaped" used to describe the peripheral shape of the support plates 26 does not mean only that the plates 26 are shaped like a circle. Rather, the term means that each plate 26 can be of any shape so long as it can support a plate-shaped object at the circumferential portion and has a through hole in the center portion to allow the projections 38 of the pushup disk 37 to push up the object. Hence, the plate 26 may be a triangular one or a polygonal one, or may be one having a slit and thus shaped like letter "C".

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A transfer device for transferring plate-shaped objects comprising:

(a) a containing section for containing the plate-shaped objects, having:

(i) a container, and a container table for receiving said container, said container having a plurality of object-receiving levels which are vertically arranged having intervals therebetween;

(b) a push-up mechanism having;

(i) a holding member, and a base for receiving said holding member, said holding member having a plurality of ring-shaped support plates which are vertically arranged having intervals therebetween, said ring-shaped support plates each having a hole in a center portion, and defining a vertical passage, (ii) a push-up disk movable upwards and downwards through the vertical passage, and (iii) an extension member extending through the vertical passage with a lower end portion disposed below a lowermost one of the ring-shaped support plates, said extension member having an upper end portion which supports the push-up disk; and (iv) drive means connected to the lower end portion of the extension member, for moving the extension member to thereby move the push-up disk up and down;

(c) a carrying mechanism having:

(i) horizontal carrying means for horizontally carrying plate-shaped objects into and out of said container between the object-receiving levels and also into and out of said holding member between the ring-shaped support plates, said horizontal carrying means having at least two forks for holding the plate-shaped objects, and horizontal drive means for independently moving the at least two forks horizontally; and (ii) lift means for holding the horizontal carrying means and for moving the horizontal carrying means upwards and downwards;

(d) the transfer device further including control means for controlling the push-up mechanism and the carrying mechanism.

wherein the control means controls the carrying mechanism to simultaneously move the at least two forks forward or backward with respect to said container in order to simultaneously move at least two of the plate-shaped objects horizontally into and out of said container and to simultaneously position at least two of the plate-shaped objects at the object-receiving levels in the container, and wherein said control means controls the carrying mechanism and the push-up mechanism to cooperate with each other such that at least two of the plate-shaped objects respectively supported by at least two of the forks are placed one at a time on a respective one of the support plates of said holding member and such that at least two of the plate-shaped objects respectively supported by said holding member are removed one at a time on a respective one of said at least two forks.

2. The device according to claim 1, wherein the control means controls the carrying mechanism and the push-up mechanism to cooperate with each other such that at least two of the forks separately move one at a time toward and away from said holding member so as to separately move the plate-shaped objects one at a time horizontally into the holding member and to place the plate-shaped objects on the support plates one at a time, or so as to remove the plate-shaped objects from the holding member one at a time.

3. The device according to claim 1, wherein, in a time when at least two of the plate-shaped objects respectively supported by at least two of the forks of the carrying mechanism are placed on the support plates of said holding member, the control means controls the carrying mechanism and the push-up mechanism such that:

the carrying mechanism moves one of said at least two forks toward said holding member so as to horizontally move the plate-shaped object supported by said one of said at least two forks to the holding member and to place the plate-shaped object at a location between one support plate and another support plate of said holding member, the push-up mechanism raises the push-up disk so as to pick up the plate-shaped object moved to the location between the one support plate and the another support plate and to support the plate-shaped object, the carrying mechanism moves the one of the at least two forks away from said holding member so as to move the one of the at least two forks out of the holding member, and the push-up mechanism moves the push-up disk down so as to move the plate-shaped object supported by the push-up disk to the said one support plate.

4. The device according to one of claims 1–3, wherein, in a time when the control means controls the carrying mechanism to move a plate-shaped object to the holding member, the plate-shaped object supported by one of said at least two forks is placed on one of the support plates of the holding member, and another plate-shaped object supported by another of the at least two forks is then placed on a further support plate located below said one support plate.

5. The device according to one of claims 1–3, wherein a distance between one of said at least two forks and another of said at least two forks is substantially equal to a distance between the support plates of the holding member.

6. The device according to one of claims 1–3, wherein a distance between one of said at least two forks and another of said at least two forks can be changed in accordance with a distance between the support plates of the holding member.

7. The device according to claim 1, wherein said horizontal carrying means further includes a rotary drive means for rotating said at least two forks in horizontal planes.

8. The device according to claim 1, wherein said plate-shaped objects comprise semiconductor wafers, LCD substrates, or printed circuit boards.

9. The device according to claim 1, wherein said plate-shaped objects are semiconductor wafers.

10. The device according to claim 9, wherein said holding member is a wafer boat.

11. The device according to claim 1, wherein said horizontal carrying means has the at least two forks disposed thereon.

12. The device according to claim 1, wherein one of said at least two forks is disposed above another of said at least two forks.

13. The device according to claim 12, wherein said one of said at least two forks is spaced above said another of said at least two forks by a distance which is substantially equal to an interval between two adjacent support plates.

14. The device according to claim 12, wherein a distance between said at least two forks is adjustable.

* * * * *